United States Patent [19]

Masaki

[11] Patent Number: 5,438,688
[45] Date of Patent: Aug. 1, 1995

[54] CHANNEL SELECTING METHOD AND HIGHSPEED SCANNING RADIO RECEIVER WHICH CONCURRENTLY SCANS MULTIPLE CHANNELS

[75] Inventor: Tateo Masaki, Ichikawa, Japan
[73] Assignee: Uniden Corporation, Chiba, Japan
[21] Appl. No.: 163,038
[22] Filed: Dec. 6, 1993

[30] Foreign Application Priority Data

Jun. 2, 1993 [JP] Japan .................. 5-131855

[51] Int. Cl.⁶ .......................................... H04B 17/02
[52] U.S. Cl. .............................. 455/161.2; 455/165.1;
455/166.1; 455/168.1; 455/183.1; 455/184.1;
455/188.1; 455/208
[58] Field of Search .............. 455/161.2, 165.1, 166.1,
455/166.2, 168.1, 180.1, 183.1, 184.1, 188.1,
208, 212; 348/731

[56] References Cited

U.S. PATENT DOCUMENTS

| | | | |
|---|---|---|---|
| 4,092,594 | 5/1978 | Baker | 455/166.1 |
| 4,603,438 | 7/1986 | Filliman | 455/166.1 |
| 4,870,492 | 9/1989 | Hakamada et al. | 455/166.1 |
| 5,020,142 | 5/1991 | Shirasaka | 455/166.1 |

FOREIGN PATENT DOCUMENTS 2-23724  1/1990  Japan .

Primary Examiner—Edward F. Urban
Assistant Examiner—Andrew Faile
Attorney, Agent, or Firm—Ratner & Prestia

[57] ABSTRACT

In a radio receiver for electronically selecting channels by way of the frequency synthesizer system, a high-speed channel scanning operation is realized. A CPU (central processing unit) detects both an SC (squelch control) signal derived from a squelch circuit and an output voltage from a frequency discriminator. The CPU controls data to be supplied to a PLL (phase-locked loop) circuit employed in a frequency synthesizer so as to perform a channel scanning operation scanning three channels concurrently. When the CPU judges that a desirable reception signal is detected based on a change in the SC signals during the concurrent scan operation. This CPU determines at which channel, the scanning operation is stopped among three channels: the central channel of the three channels searched during the concurrent scan operation, a channel higher in frequency than this searched channel by 1 step, and a channel lower in frequency than this searched channel by 1 step. Then, the CPU supplies PLL data corresponding to the channel at which the scanning operation is stopped into the PLL circuit employed in the frequency synthesizer.

10 Claims, 5 Drawing Sheets

V  :OUTPUT VOLTAGE FROM
    FREQUENCY DISCRIMINATOR
$V_L$ :LOWER THRESHOLD VOLTAGE
$V_U$ :UPPER THRESHOLD VOLTAGE

CHANNEL SELECTING METHOD AND HIGHSPEED SCANNING RADIO RECEIVER WHICH CONCURRENTLY SCANS MULTIPLE CHANNELS

BACKGROUND OF THE INVENTION

1. Field of the Invention

The present invention generally relates to a highspeed scanning type radio receiver. More specifically, the present invention relates to a radio receiver capable of scanning a plurality of channels separated from each other by a preselected frequency for every several channels, and of scanning then for every 1 channel to search a correct frequency upon detection of a signal, thereby stopping the scanning operation.

2. Description of the Prior Art

In radio receivers employing frequency synthesizer type electronic channel selector, the scanning operation is carried out for every 1 channel to perform the channel search operation.

FIG. 1 schematically shows a basic circuit arrangement of an FM radio receiver. This FM radio receiver is arranged with an antenna 10, a radio receiving unit 12 containing a converter unit for converting a frequency of an FM radio signal received from the antenna 10 into an intermediate frequency signal, a frequency discriminator 14 for converting a change in the frequencies of the intermediate frequency signal derived from the radio receiving unit 12, into a change in voltages, and a squelch circuit 16 for detecting whether or not the received signal is present based upon the output voltage from the frequency discriminator. The FM radio receiver further includes a window detector 22 for detecting whether or not a voltage corresponding to the center frequency of the intermediate frequency signal is output from the frequency discriminator 14, an audio frequency amplifier 18 for amplifying the output signal from the frequency discriminator 14, a speaker 20 for outputting the FM sound derived from the audio frequency amplifier 18, a frequency synthesizer 24 containing a phase-locked loop (PLL) circuit, a microcomputer (CPU) 26 for controlling operations of all circuit units, and a keyboard 28 for instructing the frequency synthesizer 24.

Referring now to FIG. 2, the normal scanning method of this FM radio receiver shown in FIG. 1 will be described. It should be noted that FIG. 2 represents an operation flow of the CPU 26 for executing the normal scanning operation.

During the normal channel scanning operation, the CPU 26 sends PLL data about a certain channel to the frequency synthesizer 24. The frequency synthesizer 24 synthesizes a preselected frequency based on the PLL data and then sends the synthesized frequency signal to the radio receiving unit 12. The radio receiving unit 12 mixes the synthesized predetermined frequency signal with the FM signal received via the antenna 10 by this radio receiving unit 12, thereby converting the frequency of the FM signal into the desirable intermediate frequency. The resultant intermediate frequency signal derived from the radio receiving unit 12 is supplied to the frequency discriminator 14. Then, the frequency discriminator 14 converts the intermediate frequency signal into a voltage signal in accordance with the frequency-voltage converting characteristic, and supplies the voltage signal to the squelch circuit 16 and the window detector 22. The squelch circuit 16 judges that the FM signal is received when, for instance, noise is lowered, thereby producing a squelch control signal (simply referred to as "SC" signal hereinafter). The window detector 22 generates a window signal (simply referred to as "WC" signal hereinafter) when the voltage corresponding to the center frequency of this intermediate frequency signal is detected.

In the normal scanning operation of FIG. 2, the CPU 26 starts an SC signal detecting timer (not shown in detail) so as to detect the SC signal derived from the squelch circuit 16 (step S1), thereby judging whether or not the SC signal is produced from the squelch circuit 16 (step S2). If no SC signal is detected and the SC detecting timer is not timed out (step S3), the scanning operation is returned to the previous step S2.

Otherwise, if the SC signal is detected at the step S2, then the CPU 26, judges whether or not the WD signal is produced from the window detector circuit 22 (step S4). When the window signal is detected, the CPU 26 makes such a judgement that the FM signal is received in this scanned channel, and ceases this normal scanning operation. Otherwise, if no window signal is detected, then the CPU 26 sends the PLL data about the next channel to the frequency synthesizer 24 (step S5). When the SC signal detecting timer is brought into the time out state, the CPU 26 supplies the PLL data about the subsequent channel to the frequency synthesizer 24, so that the channel searching operation for the subsequent channel is commenced. As previously described, the scanning operation of the normal scanning operation is sequentially performed for every 1 channel.

In other words, since the channel scanning operation is sequentially carried out for every 1 channel in the conventional radio receiver, there is a drawback that the entire scanning speed is low, namely a lengthy channel scanning time is required to select the desired channel.

SUMMARY OF THE INVENTION

The present invention has been made in an attempt to solve the above-described drawback of the conventional radio receiver, and has an object to provide a channel selecting method for a radio receiver, capable of scanning channels at a high speed.

Another object of the present invention is to provide a highspeed scanning type radio receiver capable of scanning channels at a high speed.

To achieve the above-described objects, according to one aspect of the present invention, a channel selecting method of a radio receiver for scanning a plurality of channels separated from each other by a predetermined frequency is characterized by comprising the steps of:

producing an oscillating frequency signal;
scanning said plurality of channels by skipping over predetermined plural channels while changing the frequency of said oscillating frequency signal;
mixing a reception signal with said oscillating frequency signal during a searching operation of a certain channel to convert the frequency of said received signal into an intermediate frequency;
converting a change in said intermediate frequencies into a change in voltages;
detecting whether or not a desired reception signal is present based on the change in said voltages; and
determining, upon detection of said desirable reception signal, at which channel the scanning operation is stopped within a range of several continuous channels containing the channel searched during said skipping scanning operation based on values of said voltages.

Also, according to another aspect of the present invention, a highspeed scanning type radio receiver for selecting a desired channel by scanning a plurality of channels separated from each other by a predetermined frequency, is characterized by comprising:

means for producing an oscillating frequency signal;

means for changing the frequency of said oscillating frequency signal in order to scan said plurality of channels by skipping over predetermined plural channels;

means for mixing a reception signal with said oscillating frequency signal during a searching operation of a certain channel, thereby converting the frequency of said reception signal into an intermediate frequency;

means for converting a change in said intermediate frequencies into a change in voltages;

means for detecting whether or not a desired reception signal is present based on said change in the voltages; and means for determining, upon detection of said desirable reception signal, at which channel the scanning operation is stopped within a range of several continuous channels containing the channel searched during said skipping scanning operation based on values of said voltages.

BRIEF DESCRIPTION OF THE DRAWINGS

For a better understanding of the present invention, reference is made of the following detailed description in conjunction with the accompanying drawings, in which.

DESCRIPTION OF THE EXEMPLARY EMBODIMENTS

Figure 3:
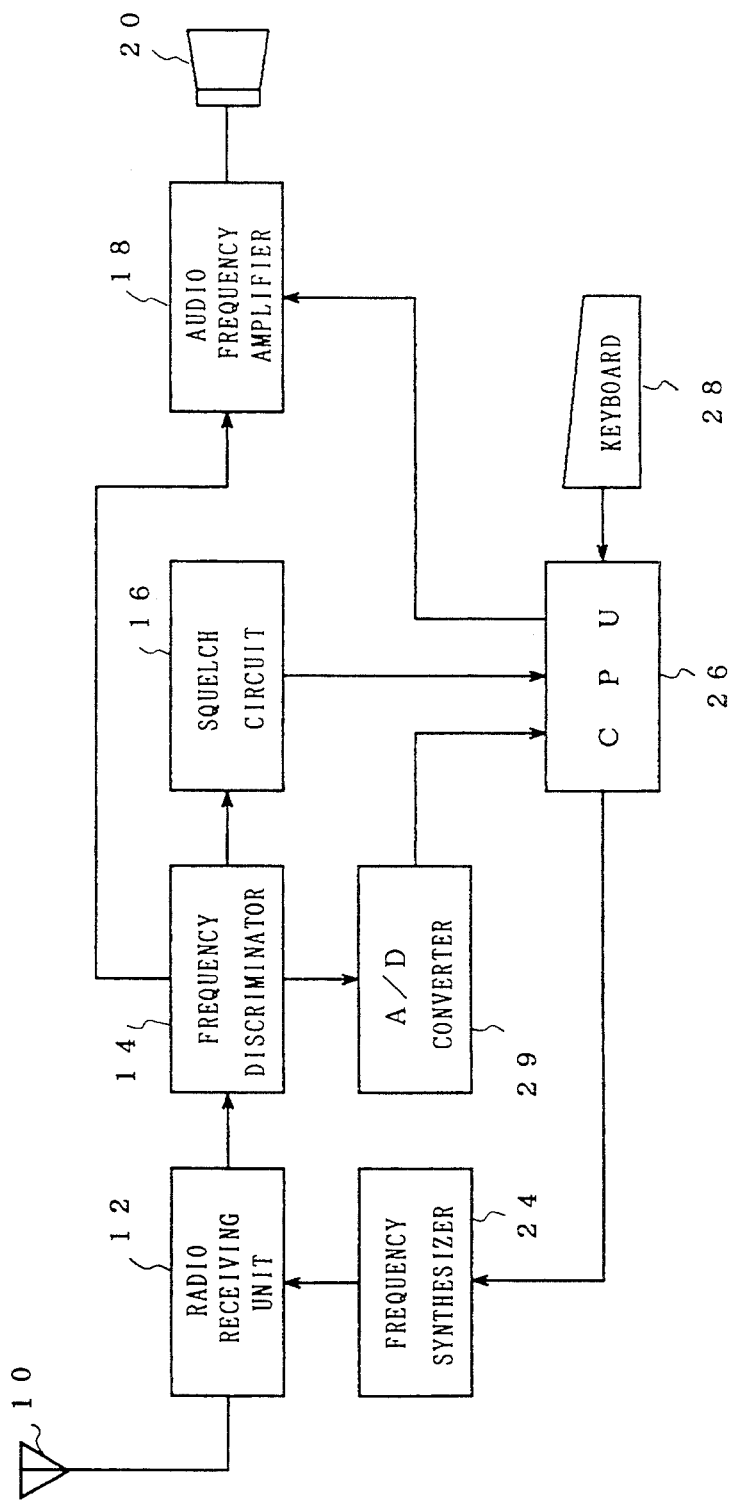
FIG. 3 is a schematic block diagram for representing a circuit arrangement of a radio receiver according to an embodiment of the present invention.

In FIG. 3, there is shown a circuit arrangement of a highspeed scanning type FM radio receiver according to an embodiment of the present invention. It should be noted that as easily seen from FIGS. 1 and 3, a feature of this highspeed scanning type FM radio receiver is to replace the window detector 22 of FIG. 1 by an analog-to-digital (A/D) converter 29 and to include the remaining circuit units identical to those of the conventional FM radio receiver shown in FIG. 1. Accordingly, the same reference numerals shown in FIG. 1 indicate the same or similar circuit units of FIG. 3. The major function of this A/D converter 29 converts the output voltages of the frequency discriminator 14 into digital signals to supply these digital signals to the CPU 26.

Figure 4:
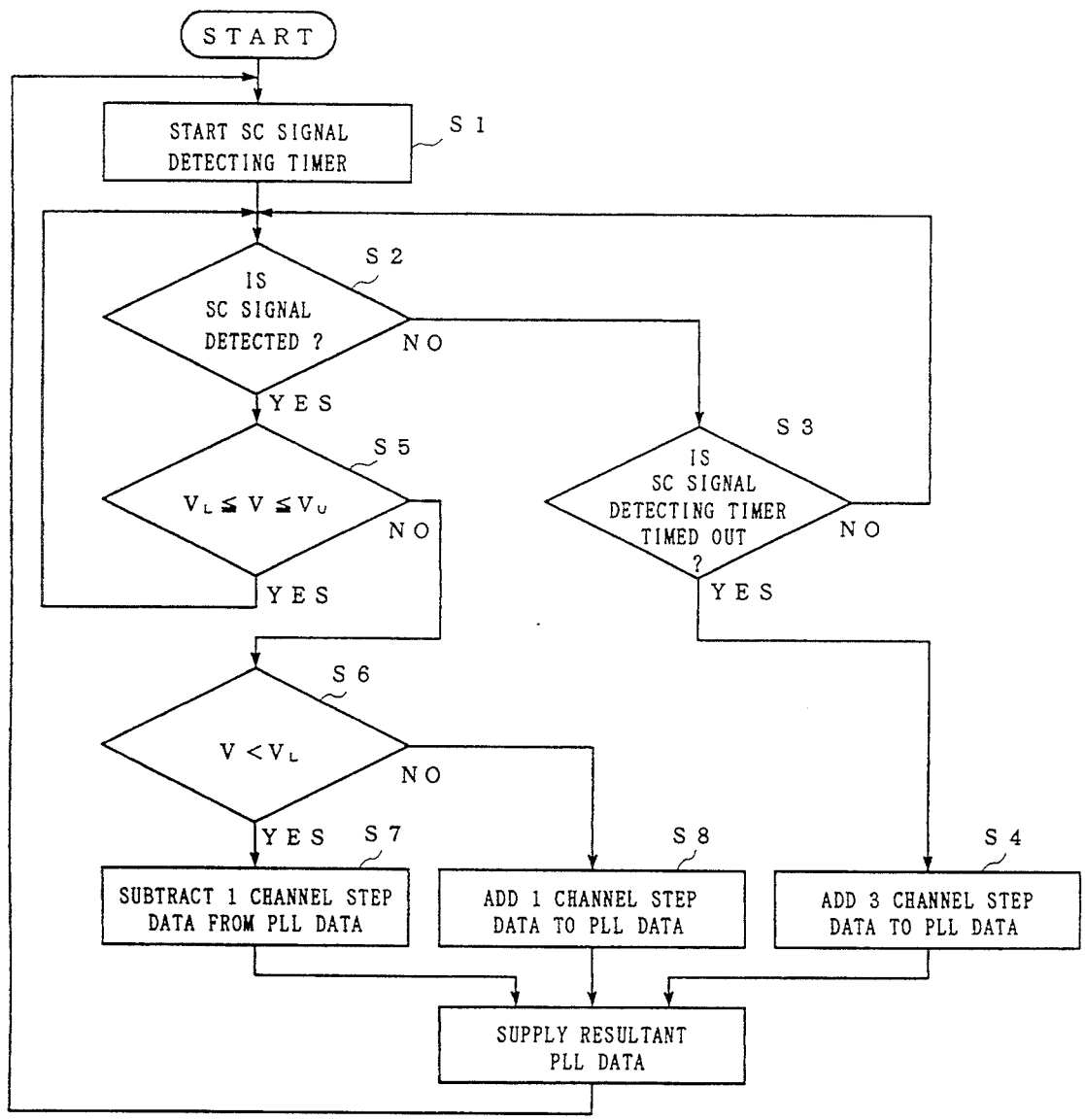
FIG. 4 is a flow chart for explaining a scanning operation performed by the radio receiver shown in FIG. 3.
Figure 5:
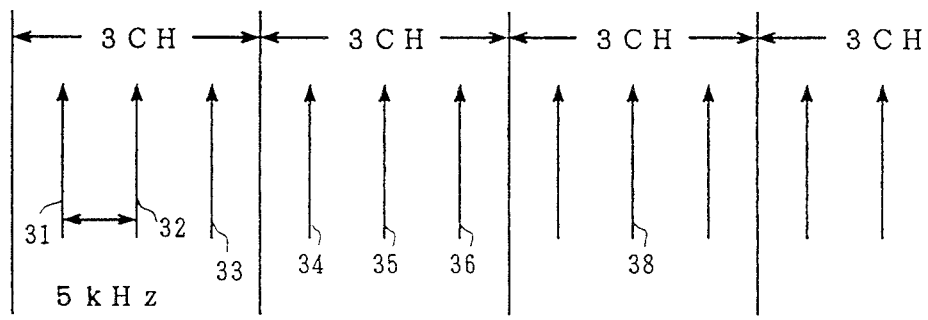
FIG. 5 schematically explains the channel skipping scanning operation of the present invention.

FIG. 4 represents an operation flow of the CPU 26 employed in the FM radio receiver according to this embodiment. In this embodiment, as shown in FIG. 5, the channel selection is carried out in such a manner that a plurality of channels are scanned by skipping over every 3 channels. It should be noted in FIG. 5 that an arrow represents the channel to be searched, and the interval between the successively scanned channels is selected to be 5 KHz. Such a channel interval frequency may be arbitrarily set into the CPU 26 from the keyboard The number of skipped channels may be determined based upon both of the channel interval frequency and the bandwidth of the intermediate frequency band-pass filter employed in the radio receiving unit 12. In this embodiment, since the channel interval frequency is selected to be 5 KHz and the bandwidth of the intermediate frequency filter is selected to be ±10 KHz, the channels may be scanned by skipping over every 3 channels.

It is now assumed that the channel 32 of FIG. 5 is being searched. The CPU 26 commences the SC signal detecting timer (step S1) to judge whether or not the SC signal is output from the squelch circuit 16, namely to judge the detection of the SC signal (step S2). If no SC signal is detected and the SC signal detecting timer is not brought into the time out state (step S3), then the process operation is returned to the step S2. If the SC signal detecting timer becomes the time out state, then the CPU 26 recognizes that no FM reception signal is present 1 in the channel 33 higher than this searched channel 32 by 1 step, 2 in the channel 31 lower than this searched channel 32 by 1 step, and 3 in this channel 32. The CPU 26 adds 3-channel step data (3×5 KHz) to the PLL data (step S4) which will then be supplied to the PLL circuit of the frequency synthesizer 24 (step S9). Accordingly, the CPU 26 commences to search the channel 35 advanced from the presently searched channel 32 by 3 channels.

The frequency synthesizer 24 synthesizes the frequency based upon this PLL data (3-channel step addition) derived from the CPU 26 and supplies this synthesized frequency to the radio receiving unit 12. The radio receiving unit 12 mixes the frequency supplied from the frequency synthesizer 24 with the frequency of the signal received by the antenna 10, and converts this reception signal into the intermediate frequency signal which will then be supplied to the frequency discriminator 14.

Again, the SC signal detecting timer is started (step S1). If the CPU 26 does not detect the SC signal at the step S2 and the SC signal detecting timer is brought into the time out condition at the step S3, then the CPU 26 judges that no reception signal is present in these three channels 34, 35, and 36, and commences another search operation with respect to the channel 38 advanced from the currently searched channel 35 by 3 channels. As described above, the channels are scanned by skipping over every 3 channels unless the SC signal is detected.

During the above-explained searching operation of the channel 35, when the SC signal is detected at the step S2, the CPU 26 judges whether or not the output voltage of the frequency discriminator 14 via the A/D converter 29 is present between an upper threshold voltage "$V_U$" and a lower threshold voltage "$V_L$" (step S5).

Figure 6:
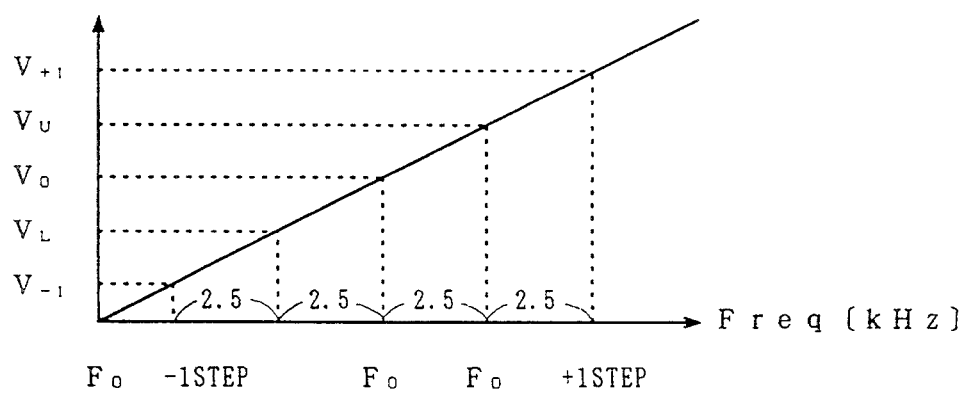
FIG. 6 indicates a relationship between the received frequencies and the voltages output from the frequency discriminator of the radio receiver shown in FIG. 3.

These threshold voltages $V_L$ and $V_U$ are set as shown in FIG. 6. That is, assuming now that the output voltage of the frequency discriminator 14 with respect to the reception frequency $F_0$ is "$V_0$", the upper threshold voltage "$V_U$" is set to an intermediate voltage between the voltage "$V_0$" corresponding to the reception frequency "$F_0$" and a voltage "$V_{+1}$" corresponding to another frequency "$F_0+1$ step (5 KHz)", whereas the lower threshold voltage "$V_L$" is set to be an intermediate voltage between the voltage "$V_0$" corresponding to the reception frequency "$F_0$" and a voltage "$V_{-1}$" corresponding to another frequency "$F_0-1$ step (5 KHz)". In other words, an interval between these voltages $V_0$ and $V_U$ corresponds to the interval of $F_0$ to $F_0-2.5$ KHz for the reception frequency, whereas an interval between these voltages $V_0$ and $V_L$ corresponds to the interval of $F_0$ to $F_0+2.5$ KHz for the reception frequency.

When the output voltage V of the frequency discriminator 14 would be present between the upper threshold voltage $V_U$ and the lower threshold voltage $V_L$, the CPU 26 could judge that the FM signal is received in this scanned channel 35 and therefore could accomplish the channel scanning operation.

If the output voltage V of the frequency discriminator 14 is not present between these two threshold voltages $V_U$ and $V_L$, the CPU 26 judges whether or not the output voltage V is lower than the lower threshold voltage $V_l$(step S6). If $V<V_L$, then 1 channel step data (5 KHz) is subtracted from the PLL data (step S7), and then another searching operation is carried out for the channel 34 lower than the 10 presently searched channel 35 by 1 scanning step as shown in FIG. 5. Otherwise, if the output voltage V is not lower than the lower threshold voltage $V_L$, namely $V>V_U$, then 1 channel step data (5 KHz) is added to the PLL data (step S8) and thereafter another searching operation is performed for the channel 36 higher than the presently scanned channel 35 by 1 scanning step.

The frequency synthesizer 24 synthesizes the frequency based upon the PLL data (namely, 1 step-added, or 1 step-subtracted PLL data) supplied from the CPU 26, and supplies the resultant synthesized frequency to the radio receiving unit 12. In the radio receiving unit 12, the signal derived from the frequency synthesizer 24 is mixed with the signal received by the antenna 10, and the reception signal is converted into the intermediate frequency signal which will then be supplied to the frequency discriminator 14.

Again, the SC signal detecting timer is commenced (step S1). The CPU 26 detects the SC signal at the step S2, and recognizes that the FM signal is received in either the channel 34, the channel 35 or the channel 36 if the output voltage V from the frequency discriminator 14 satisfies the following condition (step S5);

$$V_L \leqq V \leqq U_U.$$

Then, the CPU 26 accomplishes the channel scanning operation.

As previously described in accordance with this embodiment, the scanning operation is carried out by skipping over every 3 channels. When the SC (squelch control) signal is detected, the CPU judges the output voltage of the frequency discriminator 14. Then, since the CPU can determine at which presently scanned channel including the upper channel and the lower channel, the scanning operation is stopped, the entire channels can be scanned at a high speed, as compared with the conventional scanning method.

While the present invention has been described with reference to the exemplary embodiments, the present invention is not limited thereto, but may be modified, changed, or substituted without departing from the technical spirit and scope of the invention.

For instance, although the channel scanning operation is carried out by skipping over every 3 channels in the above-explained example, the number of skipped channels may be arbitrarily selected.

Figure 1:
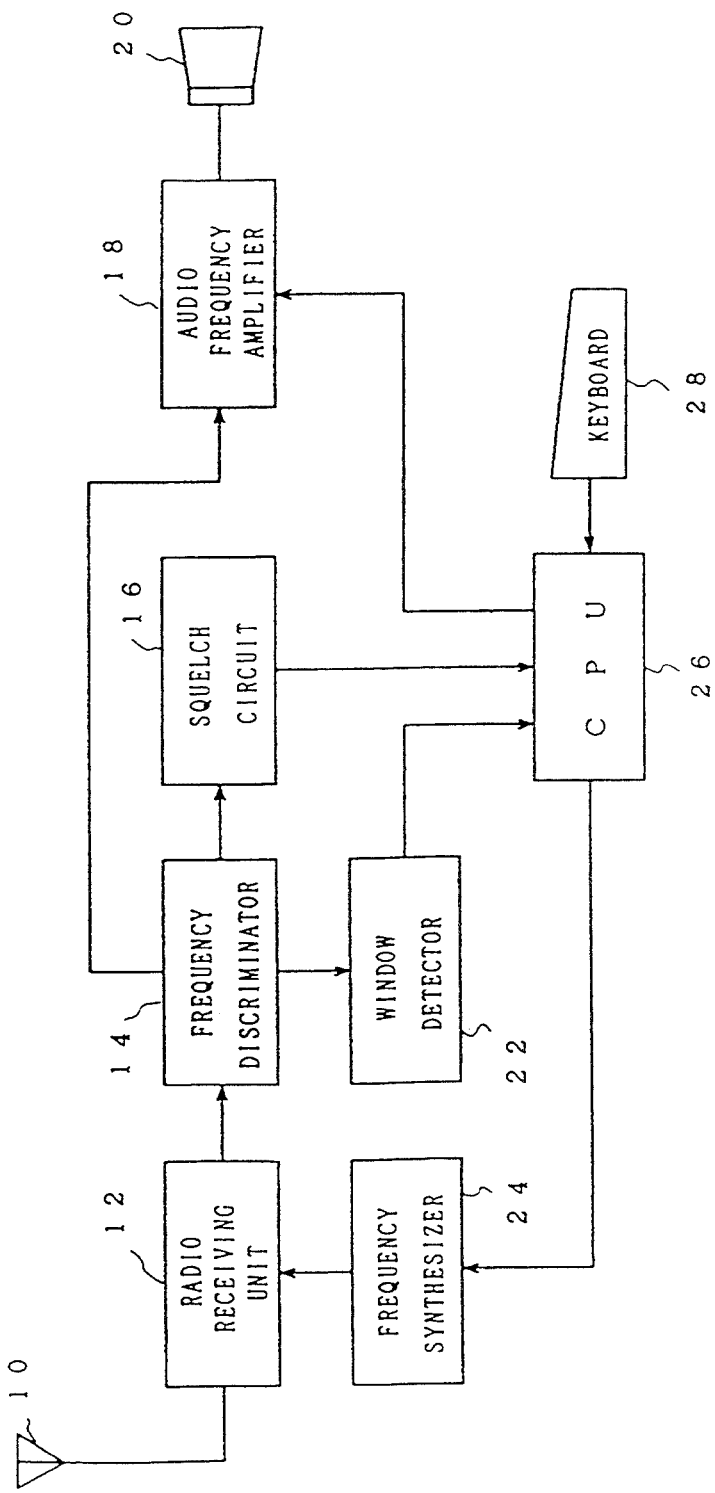
FIG. 1 (prior art) is a schematic block diagram for showing the basic circuit arrangement of the conventional radio receiver.
Figure 2:
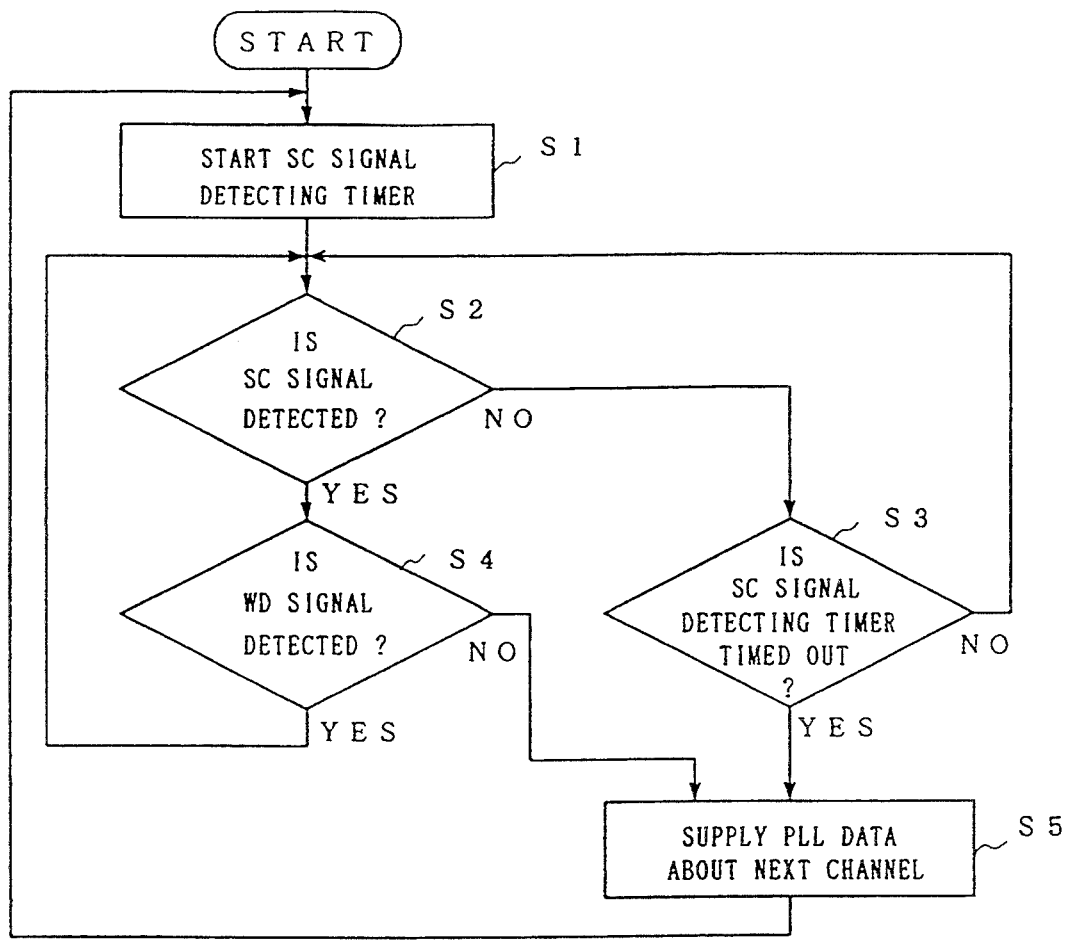
FIG. 2 (prior art) is a flow chart for explaining the scanning operation for every 1 channel effected in the conventional radio receiver of FIG. 1.

Although the CPU judges the output voltage of the frequency discriminator in the above-explained embodiment, the window detector shown in FIG. 1 may additionally have this voltage judgement function.

Furthermore, the above-described embodiment relates to the FM radio receiver. Alternatively, the present invention may be applied to an AM radio receiver.

The invention claimed is:

1. A channel-selecting method of a radio receiver for scanning a plurality of channels separated from each other by a predetermined frequency, comprising the steps of:
    producing an oscillating frequency signal;
    scanning said plurality of channels by changing said oscillating frequency signal in frequency, in increments corresponding to a multiple of said predetermined frequency;
    mixing a received signal with said oscillating frequency signal during a searching operation of a certain channel, corresponding to the frequency of the oscillating frequency signal, to convert said received signal into an intermediate frequency signal;
    converting a change in frequency of said intermediate frequency signal into a change in a voltage signal;
    detecting whether or not a desired reception signal is present in multiple channels, including the certain channel, based on the change in said voltage signal; and
    stopping the scanning step upon detection of said desired reception signal, and determining at which channel of the multiple channels the scanning step is stopped responsive to said voltage signal.

2. A channel selecting method of a radio receiver as claimed in claim 1, wherein said scan stopping step includes the steps of:
    modifying the frequency of said oscillating frequency signal in steps corresponding to said predetermined frequency in order to search a specific channel among the multiple channels;
    stopping the scanning step at the specific channel when, responsive to the modified frequency of the oscillating frequency signal, the desired reception signal is detected in a range of frequencies corresponding to the specific channel.

3. A channel selecting method of a radio receiver for scanning a plurality of channels separated from each other by a predetermined frequency, comprising the steps of:
    producing an oscillating frequency signal;
    scanning said plurality of channels by changing said oscillating frequency signal in frequency, in increments of three times the predetermined frequency;
    mixing a received signal with said oscillating frequency signal during a searching operation of a certain channel, corresponding to the frequency of the oscillating frequency signal, to convert said received signal into an intermediate frequency signals;

converting a change in frequency of said intermediate frequency signal into a change in a voltage signal;

detecting whether or not a desired reception signal is present in said received signal based on the change in said voltage signal, the desired reception signal being present in one of three channels of the plurality of channels, said three channels being 1) the certain channel, 2) a channel which is the predetermined frequency lower than the certain channel and 3) a channel which is the predetermined frequency higher than the certain channel; and stopping the scanning step upon detection of said desired reception signal, and determining at which channel of the three channels the scanning step is stopped.

4. A channel selecting method of a radio receiver as claimed in claim 3, wherein said scan stopping step includes the steps of:

modifying the frequency of said oscillating frequency signal in steps corresponding to said predetermined frequency in order to search a first specific channel among the three channels, the first channel being the predetermined frequency lower than the certain channel and to search a second specific channel, the second channel being the predetermined frequency higher than the certain channel;

stopping the scanning step when the desired reception signal is detected in the first channel or the second channel responsive to the step of modifying the frequency of said oscillating frequency signal.

5. A high speed scanning radio receiver for selecting a desired channel by scanning a plurality of channels separated from each other by a predetermined frequency, comprising:

means for producing an oscillating frequency signal;

means for changing said oscillating frequency signal, in frequency, in increments corresponding a multiple of said predetermined frequency in order to scan said plurality of channels;

means for mixing a reception signal with said oscillating frequency signal during a searching operation of a certain channel, corresponding to the frequency of said oscillating frequency signal, to convert said reception signal into an intermediate frequency signal;

means for converting a change in frequency of said intermediate frequency signal into a change in a voltage signal;

means for detecting whether or not a desired reception signal is present in multiple channels including said certain channel based on said change in the voltage signal; and means for stopping the scanning upon detection of said desired reception signal, and for determining at which channel of the multiple channels the scanning step is stopped responsive to said voltage signal.

6. A high speed scanning radio receiver for selecting a desired channel by scanning a plurality of channels separated from each other by a predetermined frequency, comprising:

means for producing an oscillating frequency signal;

means for changing said oscillating frequency signal, in frequency in increments corresponding to three times said predetermined frequency in order to scan said plurality channels;

means for mixing a received signal with said oscillating frequency signal during a searching operation of a certain channel, to convert said received signal into an intermediate frequency signal;

means for converting a change in frequency of said intermediate frequency signal into a change in a voltage signal;

means for detecting whether or not a desired reception signal is present in said received signal based on said change in the voltage signal, the desired reception signal being present in one of three channels of the plurality of channels said three channels being: 1) the certain channel, 2) a channel which is the predetermined frequency lower than the certain channel and 3) a channel that is the predetermined frequency higher than the certain channel; and means for stopping the scanning step upon detection of said desired reception signal, and for determining at which channel of the three channels the scanning step is stopped.

7. A high speed scanning radio receiver for selecting a desired channel by scanning a plurality of channels separated from each other by a predetermined frequency, comprising:

a frequency synthesizer including a PLL (phase-locked loop) circuit which produces an oscillating frequency signals;

a radio receiving unit including a converting unit for mixing a received signal with the oscillating frequency signal to produce an intermediate frequency signal representing said received signal;

a frequency discriminator for converting a change in frequencies of said intermediate frequency signal derived from said radio receiving unit into a change in voltages of a voltage signal;

a squelch circuit for detecting whether or not a desired reception signal is present in the received signal based upon the voltage signal from said frequency discriminator;

an A/D (analog-to-digital) converter for converting the output voltage of said frequency discriminator into a corresponding digital signal;

a first control circuit for supplying PLL data to said PLL circuit employed in said frequency synthesizer in order to scan said plurality of channels by said PLL data acting to change said oscillating frequency signal in increments of a multiple of said predetermined frequency; and a second control circuit for determining, upon detection of the desired reception signal, a stop channel at which the scanning step is stopped said stop channel being one of several continuous channels including a channel corresponding to the frequency of the oscillating frequency signal the stop channel being determined from the value of said voltage signal derived from said frequency discriminator via said A/D converter, and also for supplying the PLL data corresponding to the stop channel, to the PLL circuit of said frequency synthesizer.

8. A high speed scanning radio receiver as claimed in claim 7, wherein said first and second control circuits comprise a microcomputer.

9. A high speed scanning radio receiver for selecting a desired channel by scanning a plurality of channels separated from each other by a predetermined frequency, comprising:

a frequency synthesizer including a PLL (phase-locked loop) circuit which produces an oscillating frequency signal;

a radio receiving unit including a converting unit for mixing a received signal with the oscillating frequency signal to convert said received signal into an intermediate frequency signal;

a frequency discriminator for converting a change in frequencies of said intermediate frequency signal, derived from said radio receiving unit, into a change in voltages of a voltage signal;

a squelch circuit for detecting whether or not a desired reception signal is present in the received signal based upon the voltage signal from said frequency discriminator;

an A/D (analog-to-digital) converter for converting the output voltage of said frequency discriminator into a corresponding digital signal;

a first control circuit for supplying PLL data to said PLL circuit employed in said frequency synthesizer in order to scan said plurality of channels said PLL data acting to change said oscillating frequency signal in increments of three times said predetermined frequency; and a second control circuit for determining, upon detection of the desired reception signal, a stop channel at which the scanning step is stopped, said stop channel being one of three continuous channels centered about a channel corresponding to the frequency of the oscillating frequency signal; and also for supplying the PLL data corresponding to the stop channel to the PLL circuit of said frequency synthesizer.

10. A high speed scanning radio receiver as claimed in claim 9, wherein said first and second control circuits comprise a microcomputer.

* * * * *